(12) United States Patent
Aoki

(10) Patent No.: US 6,465,352 B1
(45) Date of Patent: Oct. 15, 2002

(54) METHOD FOR REMOVING DRY-ETCHING RESIDUE IN A SEMICONDUCTOR DEVICE FABRICATING PROCESS

(75) Inventor: Hidemitsu Aoki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/592,523

(22) Filed: Jun. 12, 2000

(30) Foreign Application Priority Data

Jun. 11, 1999 (JP) .......................................... 11-165681

(51) Int. Cl.$^7$ ............................................ H01L 21/302
(52) U.S. Cl. ....................... 438/689; 438/700; 438/706; 438/709; 438/710; 438/712; 438/745
(58) Field of Search ................................. 438/712, 689, 438/700, 706, 709, 710, 745

(56) References Cited

U.S. PATENT DOCUMENTS

| | | | | |
|---|---|---|---|---|
| 5,208,066 A | * | 5/1993 | Fujisaki et al. ............... | 427/96 |
| 5,289,630 A | * | 3/1994 | Ferrier et al. ................. | 29/830 |
| 5,672,577 A | * | 9/1997 | Lee ............................. | 510/175 |
| 5,731,634 A | * | 3/1998 | Matsuo et al. ............... | 257/752 |
| 5,851,860 A | * | 12/1998 | Makita et al. ............... | 438/166 |

FOREIGN PATENT DOCUMENTS

| | | | |
|---|---|---|---|
| JP | 50-36075 | 4/1975 | ......... H01G/21/304 |
| JP | 60-191255 | 9/1985 | ........... G03C/11/00 |
| JP | 1-206624 | 8/1989 | ........... H01L/21/30 |
| JP | 1-269941 | 10/1989 | ............. G03F/7/00 |
| JP | 5-47654 | 2/1993 | ......... H01L/21/027 |
| JP | 5-160022 | 6/1993 | ......... H01L/21/027 |
| JP | 8-202052 | 8/1996 | ............. G03F/7/42 |
| JP | 11-16882 | 1/1999 | ......... H01L/21/306 |
| JP | 2000-267302 | 9/2000 | ............. G03F/7/42 |

* cited by examiner

*Primary Examiner*—Benjamin L. Utech
*Assistant Examiner*—Vanessa Perez-Ramos
(74) *Attorney, Agent, or Firm*—Hayes Soloway P.C.

(57) ABSTRACT

In a semiconductor device fabricating process, a copper-based metal film is formed on an insulating layer, and an insulating film is formed on the copper-based metal film. A patterned resist film is formed on the insulating film, and the insulating film is dry-etched using the patterned resist film as a mask to form a hole penetrating through the insulating film. Thereafter, a plasma treatment using an non-oxidizing gas is carried out, and furthermore, a wet treatment using a resist remover liquid is carried out, for removing the resist film and a resist surface hardened layer which was generated in the dry-etching.

22 Claims, 12 Drawing Sheets

METHOD FOR REMOVING DRY-ETCHING RESIDUE IN A SEMICONDUCTOR DEVICE FABRICATING PROCESS

BACKGROUND OF THE INVENTION

The present invention relates to a semiconductor device fabricating process, and more specifically to a method for removing a resist film and a deposition after a dry-etching is carried out using the resist film as a mask in a semiconductor device fabricating process.

In a semiconductor device fabricating process, a through-hole or others is formed by utilizing a lithography process. Ordinarily, after a patterned resist film is formed, a dry-etching is carried out using the resist film as a mask, and thereafter, the resist film is removed. Here, when the dry-etching is carried out, an etching residue and a resist surface hardened layer occur. It is an important technical problem to remove these deposits without damaging metal layers and semiconductor layers which constitute a semiconductor device. In the following, a prior art example for removing the etching residue and the resist surface hardened layer will be described on an example of a process for forming a through-hole on a copper interconnection.

As shown in FIG. 1A, a buried copper interconnection is formed. After an HSQ (hydrogen silsesquoxane file 1 is formed on a semiconductor substrate (not shown) on which circuit-components such as transistors are formed, a copper interconnection composed of a TaN film 2 (barrier metal film) and a copper film 3 is formed in the HSQ film 1 by using a Cu damascene process. Then, a silicon nitride film 4 and another HSQ film 5 are formed on the HSQ film 1 in the named order. Furthermore, a resist film 6 patterned to have a predetermined shape is formed on the HSQ film 5. Here, the silicon nitride film 4 has a film thickness on the order of 20 nm. The resist film 6 is constituted of for example a chemical amplification resist.

Next, the HSQ film 5 and the silicon nitride film 4 are dry-etched using the resist as a mask until the copper film 3 is exposed, so that a through-hole 7 is formed as shown in FIG. 1B. An opening diameter of the through-hole is on the order of 0.2 $\mu$m. An etching gas being used is a fluorocarbon based gas. In this dry-etching, an etching residue 8, which is a reaction product of the etching gas and the copper film 3, is deposited on an inner wall surface of the through-hole. In addition, a resist surface hardened layer 9 is formed on the resist film 6. The resist surface hardened layer 9 is composed of a reaction product of the etching gas and a resist material, copper, etc., and is generally difficult to remove.

Thereafter, as shown in FIG. 1C, the resist film 6 is ordinarily removed by an oxygen plasma ashing while maintaining the substrate temperature at 150° C. to 250° C., and then, deposits such as the etching residue 8 and a resist residue 11 are removed by a wet treatment using a liquid remover.

The oxygen plasma ashing causes an active species such as oxygen radicals generated by a plasma discharging, to react with the resist resin activated by the heating. Thus, an organic resin, which is the base of the resist, reacts with the oxygen active species generated by the plasma discharging, to be broken down into a gas such as $CO_2$ and $H_2O$, with the result that the resist is removed from the surface of the substrate. When the active oxygen species and the oxygen ion species in the oxygen plasma chemically react with the organic resin in the resist, since a threshold temperature exists, it is necessary to maintain the resist at a temperature not less than a predetermined constant temperature, in order to perform the oxygen plasma ashing. For this purpose, it is an ordinary practice to maintain the substrate at a temperature in the range of 150° C. to 250° C. However, if the ashing is carried out at this temperature, oxidation proceeds from a surface of the copper film into the inside of the copper film, so that an oxidized region 12 is formed as shown in FIG. 1C. If the oxidized region 12 is formed, an interconnection resistance increases, and in addition, a contact resistance between the copper film 3 and a through-hole filling metal is also increased.

In order to avoid this problem, it may be considered to remove the resist film and the deposits by only a wet treatment using a resist remover liquid, without using the oxygen plasma ashing. FIG. 2 schematically illustrate a condition after the wet treatment is carried out. With this wet treatment, the resist film 6 and the etching residue 8 are removed, but the resist surface hardened layer 9 is not removed and still remains on the HSQ film 5. As mentioned above, since the resist surface hardened layer 9 is composed of the reaction product of the etching gas and the resist material, the copper, etc., it is difficult to remove the resist surface hardened layer 9 by the wet treatment using the resist remover liquid. If the resist surface hardened layer 9 remains, when an upper level interconnection is formed later, a defective deposition of a barrier metal film occurs, with the result that the yield of production is lowered.

As a method for avoiding the remains of the resist surface hardened layer 9 and also for preventing oxidation of the copper film 3, it is carried out to thicken the silicon nitride film 4 to form an etching stopper film and to form a through-hole by a two-step dry etching. This process will be described with reference with FIGS. 3A to 3F, 4, 5A and 5B.

Similarly to FIG. 1A, a buried copper interconnection as shown FIG. 3A is formed. However, the silicon nitride film 4 is formed to have a film thickness of about 50nm, which is larger than that in the example shown in FIG. 1A. This silicon nitride film 4 will be used as an etching stopper in a later step.

The HSQ film 5 is dry-etched using the resist 6 as a mask until the silicon nitride film 4 is exposed, so that a through-hole is formed as shown in FIG. 3B. An opening diameter of the through-hole is on the order of 0.2 $\mu$m. As an etching gas, a gas is used which can etch the silicon oxide film at an etching rate higher than that for a silicon nitride film. After the etching, an etching residue 10 is deposited on an inner wall surface of the through-hole, and a resist surface hardened layer 9 is formed on the resist film 6.

Thereafter, the resist 6 is removed by an oxygen plasma ashing. At this time, a resist residue 11 remains on the HSQ film 5 as shown in FIG. 3C. After the ashing, a wet treatment using a resist remover liquid is carried out to remove the resist residue 11 and the etching residue 10, as shown in FIG. 3D. Then, the silicon nitride film 4 is dry-etched to expose a surface of the lower level interconnection 3, as shown in FIG. 3E. As an etching gas, a fluorocarbon based gas is used. At this time, an etching residue 8 is deposited on the inner wall surface of the through-hole. Succeedingly, the wet treatment using the resist remover liquid is carried out again to remove the etching residue, as shown in FIG. 3F. Thereafter, a barrier metal is deposited on an inner surface of the through-hole, and a buried conducting film is deposited, and then, a surface is planarized. Thus, a multi-level interconnection is completed.

As mentioned above, if the method of thickening the silicon nitride film to use the thickened silicon nitride film as the etching stopper is utilized, it is possible to prevent the oxidation of the copper film 3 -to some degree. However, this method needs an increased number of steps, and in some cases, it is not possible to stop the dry etching at the silicon nitride film with good controllability, so that deterioration of the copper film 3 caused by the oxidation cannot be satisfactorily prevented. The reason for this will be described in the following.

When the lower level interconnection is formed of copper which is difficult to etch, a buried structure is ordinarily adopted, and an interconnection is completed by means of a Cu damascene process utilizing a CMP (chemical mechanical polishing) process. However, in the CMP process, there occurs a phenomenon often called a "dishing" in which a center portion of the copper film is recessed as shown in FIG. 4. This "dishing" is attributable to a difference in polishing rate between the barrier metal film and the copper film. If this "dishing" occurs, when the silicon nitride film 4 is formed on the HSQ film 1 having the lower level interconnection (2+3) formed thereon, the film thickness of the silicon nitride film 4 becomes thin at an edge of the copper film 3, as designated by the reference number 4A in FIG. 4. In some cases, particles generated in the CMP process remains in a recessed portion, so that a thinned portion occurs in the silicon nitride film 4 because of the remaining particles.

On the other hand, in the dry etching for forming the through-hole as shown in FIG. 3B, misalignment often occurs between the lower level interconnection and an opening formed in the resist film 6 as shown in FIG. 5A. When the misalignment occurs in a resist patterning, if the silicon nitride film 4 has the thinned portion as mentioned above, the dry etching cannot be stopped at the silicon nitride film so that the copper film is exposed as shown in FIG. 5A. In this case, an oxidized region 12 occurs in the copper film 2 as shown in FIG. 5B, with the result that an interconnection resistance increases, and in addition, a contact resistance is also increased.

Recently, with advanced microminiaturization of the semiconductor device, a so-called "borderless interconnection" equalizing the width of an interconnection and the diameter of a through-hole, becomes widely adopted. Therefore, a damage of the copper film attributable to the misalignment becomes more significant.

Furthermore, when a plurality of through-hole having different opening diameters are formed, it becomes more difficult to stop the etching at the silicon nitride film. Since the etching rate becomes low in a through-hole having a small opening diameter because of a micro-loading effect, the dry etching becomes relatively rapid in a through-hole having a large opening diameter. Accordingly, when a plurality of through-hole having different opening diameters are formed in the same etching process, an overetching time in the through-hole having the large opening diameter becomes long, with the result that the etching of the silicon nitride film proceeds in the through-hole having the large opening diameter.

Because of the above mentioned circumstance, when the silicon nitride film is used as the etching stopper film, the silicon nitride film has to be formed to have a sufficient film thickness. Specifically, the silicon nitride film is required to have a film thickness of not less than 50 nm. However, if the film thickness of the silicon nitride film becomes large, a parasite capacitance between adjacent interconnections becomes large-because of a fringe effect. FIG. 6 illustrates a diagrammatic sectional view illustrating this phenomenon.

As shown in FIG. 6, between an interconnection 50 and another interconnection 51 which are adjacent to each other in the same interconnection level, there exists a parasite capacitance 52 having an $SiO_2$ film 54 as a capacitor dielectric film and another parasite capacitance 53 having a SiN film 55 as a capacitor dielectric film. Since the $SiO_2$ film has a relatively low dielectric constant, the parasite capacitance 52 is relatively small. However, since the dielectric constant of the SiN film is about a double of the dielectric constant of the $SiO_2$ film, the parasite capacitance 53 is relatively large. The magnitude of the overall parasite capacitance between adjacent interconnections is greatly influenced by the magnitude of the parasite capacitance 53. Therefore, when the film thickness of the SiN film 55 becomes large, the parasite capacitance between the interconnection 50 and the interconnection 51 remarkably increases, with the result that there occur various problems including a cross-talk.

As mentioned above, in the through-hole forming process, it was difficult to efficiently remove the resist film and the resist surface hardened layer while preventing the increase of the resistance of the copper film and the increase of the parasite capacitance between adjacent interconnections. However, when the through-hole is formed in a multi-level interconnection forming process, if any resist surface hardened layer remains, a barrier metal, which will be deposited later, will cause a defective deposition. Under this circumstance, a technology for efficiently removing the resist film and the resist surface hardened -layer without deteriorating the interconnection formed of the copper film.

Recently, it becomes much to form an interlayer insulating film of a low dielectric constant material such as an inorganic SOG (spin on glass), an organic SOG and HSQ in order to reduce the parasite:

capacitance between adjacent interconnections. However, these low, dielectric constant material has a problem in which if the low dielectric constant material is exposed to the oxygen plasma when the resist is removed, the dielectric constant elevates.

BRIEF SUMMARY OF THE INVENTION

Accordingly, it is an object of the present invention to provide a method which has overcome the above mentioned problems of the prior art.

Another object of the present invention is to provide a method for removing a resist film and a resist surface hardened layer which is formed when a dry etching is carried out to expose an easily oxidizable film such as a copper interconnection and a low dielectric constant film after the films is formed, with giving no damage to the easily oxidizable film.

Still another object of the present invention is to provide a method for removing a resist film and a resist surface hardened layer, with giving no damage to a copper based metal film, in a process for forming a through-hole by means of a two-step dry etching using an etching stopper film such as a silicon nitride film, even if a thinned portion is generated in the etching stopper film and/or a misalignment of a patterned resist film occurs.

The above and other objects of the present invention are achieved in accordance with the present invention by a semiconductor device fabricating process including the steps of forming an easily oxidizable film on an insulating layer, forming a patterned resist film on the easily oxidizable film, dry-etching the easily oxidizable film using the patterned resist film as a mask to expose the easily oxidizable film, carrying out a plasma treatment using an non-oxidizing gas, and carrying out a wet treatment for removing the resist film and a resist surface hardened layer which was generated in the dry-etching.

According to another aspect of the present invention, there is provided a semiconductor device fabricating process including the steps of forming a copper-based metal film on an insulating layer, forming an insulating film on the copper-based metal film, forming a patterned resist film on the insulating film, dry-etching the insulating film using the patterned resist film as a mask to form a hole penetrating through the insulating film, carrying out a plasma treatment using an non-oxidizing gas, and carrying out a wet treatment for removing the resist film and a resist surface hardened layer which was generated in the dry-etching.

According to a third aspect of the present invention, there is provided a semiconductor device fabricating process including the steps of forming a copper-based metal film on an insulating layer, forming an etching stopper film on the copper-based metal film, forming an insulating film on the etching stopper film, forming a patterned resist film on the insulating film, dry-etching the insulating film using the patterned resist film as a mask to form in the insulating film an hole reaching the etching stopper film, carrying out a plasma treatment using an non-oxidizing gas, carrying out a wet treatment for removing the resist film and a resist surface hardened layer which was generated in the dry-etching, and removing the etching stopper film.

According to a fourth aspect of the present invention, there is provided a semiconductor device fabricating process including the steps of forming a patterned resist film on an insulating film which is formed of a material selected from the group consisting of HSQ, organic SOG and inorganic SOG, dry-etching the insulating film using the patterned resist film as a mask, carrying out a plasma treatment using an non-oxidizing gas, and carrying out a wet treatment for removing the resist film and a resist surface hardened layer which was generated in the dry-etching.

The above mentioned semiconductor device fabricating processes in accordance with the present invention, includes the dry-etching using the patterned resist film as a mask. Because of this dry-etching, the resist surface hardened layer is generated. As mentioned hereinbefore, the resist surface hardened layer is considered to be generated as the result of a reaction between the etching gas and a resist material, copper, etc., and is generally difficult to remove by a resist remover liquid. In the present invention, the plasma treatment using the non-oxidizing gas is firstly carried out, and then, the wet treatment is carried out, for the purpose of removing the resist film and the resist surface hardened layer. Why the resist surface hardened layer can be favorably removed, has not yet been necessarily clarified. But, it could be considered that, by means of the plasma treatment using the non-oxidizing gas, the resist surface hardened layer is broken and the change of properties occurs so that the resist surface hardened layer becomes a condition which can be easily removed by the resist remover liquid.

As seen from the above, the present invention is characterized by using the plasma treatment using the non-oxidizing gas, as a means for causing the change of properties in the resist surface hardened layer. Incidentally, an ashing method by a plasma treatment using a non-oxidizing gas, is known in the prior art (for example, JP-A-05-160022). However, this method is essentially different from the present invention in formation utilizing the plasma of the non-oxidizing gas.

First, in the present invention, the "easily oxidizable film" means a film which is easily oxidized if the film is exposed to an oxygen atmosphere, with the result that a characteristics inherent to the film itself is lost.

The "easily oxidizable film" can be exemplified by a copper based metal film. If the copper based metal film is exposed to an oxygen atmosphere, oxidation easily proceeds from the surface into the inside, with the result that, a low resistance, which is a characteristics inherent to the copper based metal film, is lost. Here, the copper based metal film means a metal film formed of copper or copper alloy. The copper based metal film is used as an interconnection film and a plug for connecting between different levels of interconnections. Here, the copper alloy can be exemplified by a copper/aluminum alloy. In this case, when the metal film is formed of the copper alloy containing the copper of not less than 90 weight %, an advantage of the present invention is remarkable. As known to persons skilled in the art, the copper based metal film can be formed by various processes, such as an electroplating, a sputtering, a CVD (chemical vapor deposition) process, etc. When the copper based metal film is used as the interconnection or the plug, the copper based metal film can be formed by the damascene process. Namely, a recess is formed at a predetermined portion of an interlayer insulating film, and a copper based metal film is deposited to fill up the recess, and then, an unnecessary portion of the copper based metal film is removed by for example a CMP process. Thus, the copper based metal film is formed in an interconnection pattern.

Furthermore, the "easily oxidizable film" can be exemplified by an insulating film formed of a low dielectric constant material such as HSQ, organic SOG and inorganic SOG. This type of low dielectric constant material can be said to be a typical example of the "easily oxidizable film", because tie characteristics of the low dielectric constant is lost if this type of low dielectric constant material is exposed to the oxygen atmosphere.

The present invention can provide a technology for efficiency removing the resist film and the resist surface hardened layer while preventing oxidation of the easily oxidizable film. In the present invention, therefore, the easily oxidizable film includes various film which will lose its characteristics by oxidation. Accordingly, it should be understood that the above mentioned examples merely show a typical example of the easily oxidizable film, but the easily oxidizable film is in no way limited to only the above mentioned examples.

In the present invention, the non-oxidizing gas means a gas which does not substantially contain oxygen. For example, the non-oxidizing gas means can be defined by a gas having an oxygen content of not greater than 5000 ppm, preferably, not greater than 100 ppm. This non-oxidizing gas can be exemplified by hydrogen, ammonia, nitrogen, an inert gas, and their mixed gas. Among these gases, hydrogen, nitrogen and their mixed gas can be preferably used. Furthermore, the non-oxidizing gas is preferred to be a reducing gas which contains hydrogen. By using this type of non-oxidizing gas, it is possible to remove the resist film and the resist surface hardened layer while preventing oxidation of the easily oxidizable film. Here, the reducing gas can be exemplified by hydrogen or a mixed gas composed of hydrogen and at least one selected from the above exemplified non-oxidizing gases excluding hydrogen. For example, a mixed gas composed of hydrogen and nitrogen and/or an inert gas can be exemplified. When the non-oxidizing gas is the reducing gas which contains hydrogen, the hydrogen content is not limited from a theoretical view, but preferably,.is limited to 1 to 50 volume % if attention is paid to safety.

The flow rate of the non-oxidizing gas is suitably determined by considering the volume of a chamber in which the treatment is carried out, and in order to realize a stable plasma treatment. Ordinarily, the flow rate of the non-oxidizing gas is set on the order of 10 to 200 sccm (the flow rate of the whole of the mixed gas when the mixed gas is used). Incidentally, when the plasma treatment using the non-oxidizing gas is carried out in the present invention, a substrate temperature and a pressure are not limited. For example, the substrate temperature can be set at 50 to 250° C., and the pressure can be set at not greater than 2 torr.

When the plasma treatment using the non-oxidizing gas is carried out in the present invention, an RF bias may or may not be applied to a semiconductor substrate. When the RF bias is applied, the semiconductor substrate is placed on an electrode connected to a high frequency power supply, and the plasma treatment using the non-oxidizing gas is carried out in a condition in which the RF bias is applied to the semiconductor substrate. In this case, bombardment of active species having a high energy occurs on the resist surface, to cause sufficient damage and change of properties in the resist surface hardened layer formed on the resist film, with the result that it becomes further easy to remove the resist surface hardened layer by use of a wet treatment using the remover liquid. The RE bias can be suitably determined dependently upon the type of plasma processing machine, but is ordinarily set to 10 to 50 W. If the RF. bias is too high, it is in some cases that the surface of the easily oxidizable film such as the copper interconnection and the low dielectric constant film is damaged. Incidentally, it is preferable to apply the RF bias in such a manner that the active species in the plasma is accelerated in a direction perpendicular to the substrate. From this viewpoint, when the RF bias is applied, the pressure is preferred to be set at as a low value as 0.1 torr to 1 torr.

A treatment time of the plasma treatment using the non-oxidizing gas depends upon the type of treating machine, but is set to be preferably 30 seconds to 10 minutes, more preferably 1 minute to 3 minutes. Incidentally, it is possible to remove the resist film by only the plasma treatment using the non-oxidizing gas, however, the removing rate is low so that a long time is required for removal. For example, when a chemical amplification resist is removed by only a hydrogen/nitrogen plasma treatment, the removing rate is on the order of 0.1 $\mu$m/min In the present invention, after the plasma treatment using the non-oxidizing gas is carried out, the wet treatment is carried out. This wet treatment is preferably carried out by using a resist remover liquid which uses amine compound, because it is possible to easily remove the resist surface hardened layer which was subjected to the plasma treatment.

In the present invention, the resist film can be formed -of various materials. In ordinary cases, a conventional resist material formed of an organic compound is used. For example, a novolak type of resist material or a chemical amplification resist material can be used. The chemical amplification resist material can be exemplified by a combination of a polyhydroxystyrene partially protected by a tertiary butoxycarbonyl group (abbreviated to "t-BOC") and triphenyl sulfonium trifluorosulfonate (acid generating agent).

The above and other objects, features and advantages of the present invention will be apparent from the following description of preferred embodiments of the invention with reference to the accompanying drawings.

DETAILED DESCRIPTION OF THE INVENTION

Now, the present invention will be described in detail with reference to the accompanying drawings.

First Embodiment

A first embodiment of the method in accordance with the present invention for removing the etching residue and the resist surface hardened layer in a semiconductor device fabricating process, will be described with reference to FIGS. 7A to 7F which are diagrammatic sectional views for illustrating the first embodiment.

Figure 7A:
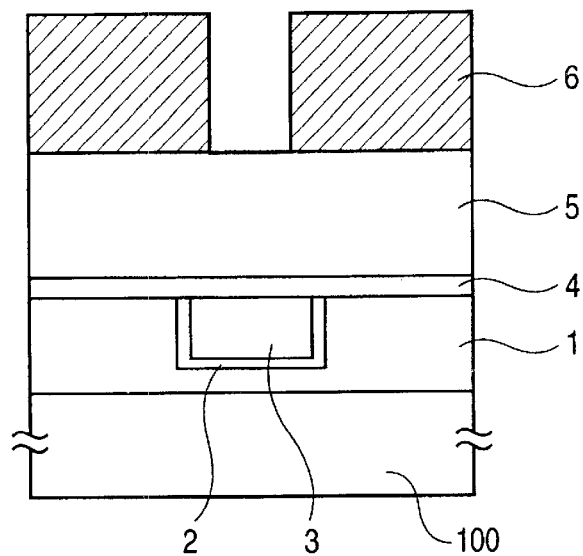
FIGS. 7A to 7F are diagrammatic sectional views for illustrating a first embodiment of the method in accordance with the present invention for removing the etching residue and the resist surface hardened layer in a semiconductor device fabricating process.

As shown in FIG. 7A, after an HSQ (hydrogen silsesquoxane) film 1 is formed on a semiconductor substrate 100 (shown in only FIG. 7A and omitted in the other drawings for simplification of drawings) on which circuit-components such as transistors (not shown) are formed, a lower level metal interconnection is formed by a known damascene process. This level metal interconnection is composed of a barrier metal film formed of a TaN film 2 having a film thickness of 50 nm and a copper film 3 formed on the barrier metal film.

After the lower level metal interconnection is formed, a silicon nitride film 4 having a film thickness of 20 nm) and another HSQ film S (having a film thickness of 1200 nm) are formed on the HSQ film 1 in the named order to cover the lower level metal interconnection. Furthermore, a resist film 6 patterned to have a predetermined shape is formed on the HSQ film 5. Here, the resist film 6 is constituted of for example a chemical amplification resist composed of a combination of a polyhydroxystyrene partially protected by a tertiary butoxycarbonyl group (abbreviated to "t-BOC") and triphenyl sulfonium trifluorosulfonate (acid generating agent).

Figure 7B:
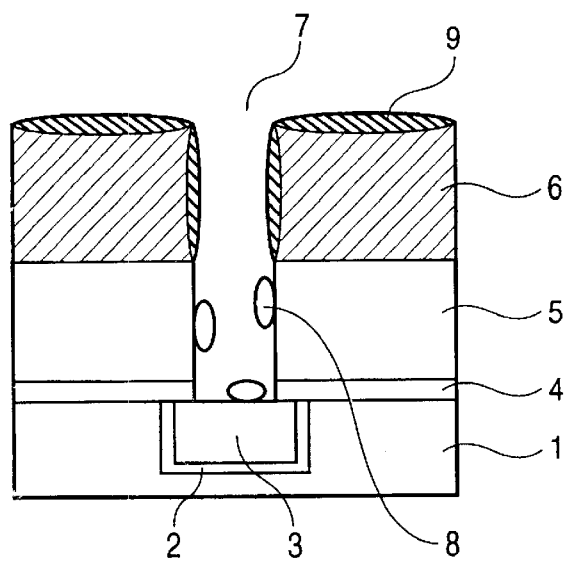

Next, the HSQ film 5 and the silicon nitride film 4 are dry-etched using the resist 6 as a mask until the copper film 3 is exposed, so that a through-hole 7 is formed as shown in FIG. 7B. An opening diameter of the through-hole is on the order of 0.2 μm. An etching gas being used is a mixed gas of $CHF_3$ and Ar. In this dry-etching, an etching residue 8, which is a reaction product of the etching gas and the copper film 3 and others, is deposited on an inner wall surface of the through-hole 7. In addition, a resist surface hardened layer 9 is formed on the resist film 6.

Succeedingly, by using a known ECR (electron cycrotron resonance) plasma machine, a hydrogen/nitrogen plasma treatment was carried out under the following condition:

| Processing gas | Mixed gas of $H_2$ and $N_2$ ($H_2/N_2$ = 1/10 (volume ratio)) |
|---|---|
| Substrate temperature | 150° C. |
| Pressure | 2 torr |
| RF bias | 0 |
| Gas flow rate | $H_2$ = 5 sccm $N_2$ = 50 sccm |
| Microwave power | 1000 W |

Figure 7C:
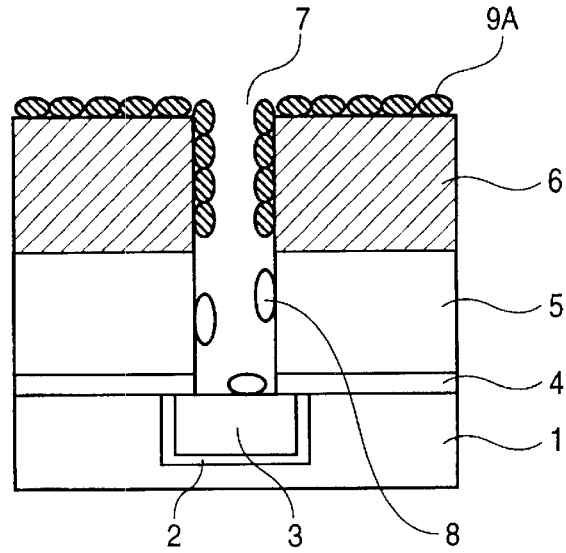

As a result, as shown in FIG. 7C, the resist surface hardened layer 9 causes the change of properties to become a property-changed resist hardened layer 9A which can be removed by a resist remover liquid.

Figure 7D:
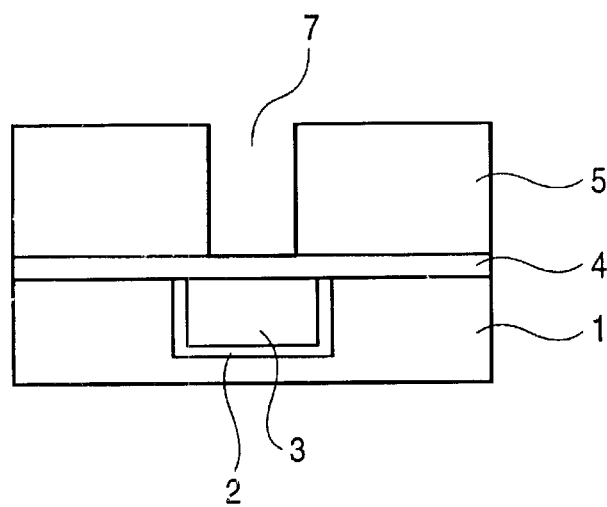

Succeedingly, a wet treatment is carried out by using a resist remover liquid which contains amine compound, so as to remove the resist film 6 as well as the etching residue 8 and the property-changed resist hardened layer 9A which were plasma-treated. Here, in the prior art, it was difficult to remove the resist surface hardened layer 9 by use of the resist remover liquid. However, in the shown embodiment, since the resist surface hardened layer 9 is treated by the hydrogen/nitrogen plasma treatment as mentioned above, the resist surface hardened layer 9 is converted into the property-changed resist hardened layer 9A which can be removed by a resist remover liquid. Therefore, the inner surface of the through-hole 7 and the surface of the HSQ film 5 are brought into a clean condition by the wet treatment using the resist remover liquid, as shown in FIG. 7D.

Figure 7E:
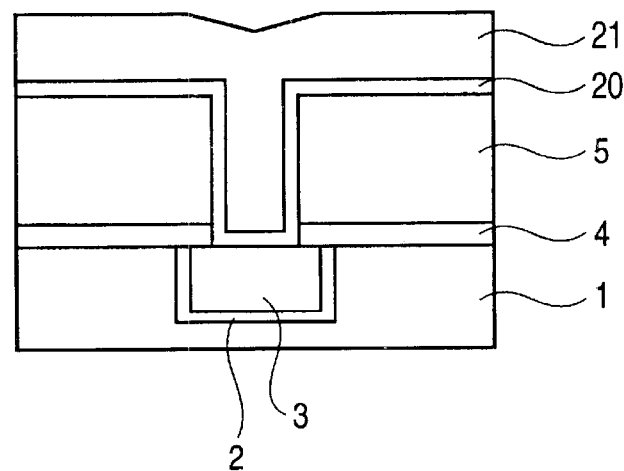
Figure 7F:
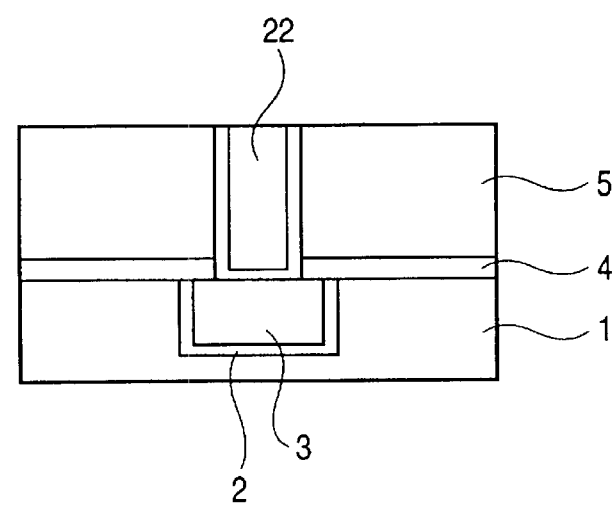

Thereafter, a barrier metal film 20 formed of TaN and a copper film 21 are deposited on the whole surface in the named order, as shown in FIG. 7E, and then, the deposited barrier metal film 20 and copper film 21 are planarized by a CMP process, with the result that a plug 22 for connecting between different levels of interconnection is formed as shown in FIG. 7F. Furthermore, an upper level interconnection (not shown) is formed on the plug 22. Thus, a multi-level interconnection is completed.

As seen from the above, in the shown embodiment, in place of the prior art resist removal by the oxygen plasma ashing, the resist is removed by a combination of the hydrogen/nitrogen plasma treatment and the wet treatment using the resist remover liquid. As a result, the resist film and the deposits can be removed while preventing the oxidation of the copper film 3. In addition, it is possible to prevent the elevation of the dielectric constant of the HSQ film.

In the above mentioned embodiment, incidentally, the silicon nitride film 4 is not provided as the etching stopper film, but is provided to prevent the oxidation of the copper film 3 and the diffusion of the copper. In order for the silicon nitride film 4 to exert this function, it is sufficient even if the film thickness of the silicon nitride film 4 is small. In this embodiment, therefore, the silicon nitride film 4 has the film thickness of 20 nm. Accordingly, it is possible to effectively prevent the increase of the parasite capacitance between adjacent interconnections.

Reference Examples

Figure 9:
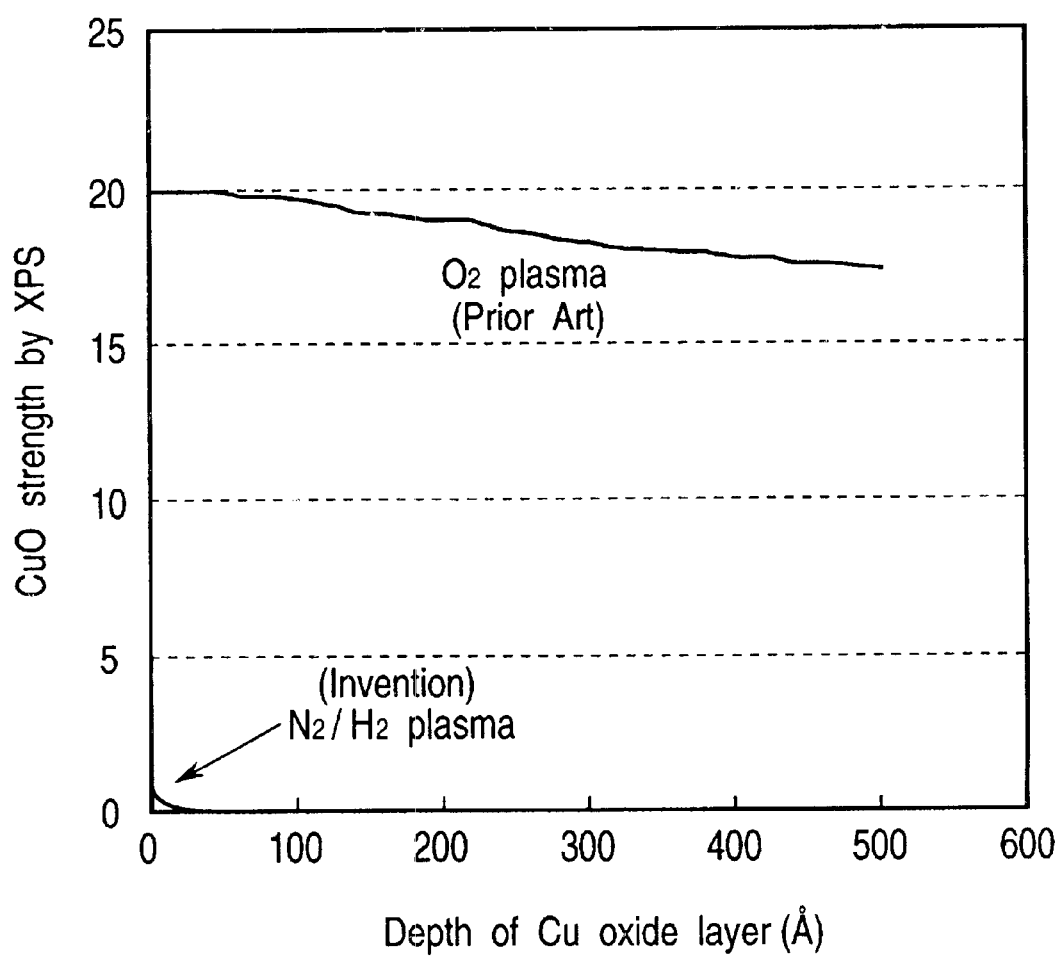
FIG. 9 is a graph illustrating the depth of the copper oxide layer after the plasma treatment, measured by XPS (X-ray photoelectron spectroscopy).

Samples were prepared in which a copper film is deposited by an electroplating on a silicon substrate covered with a silicon oxide film. These samples thus prepared are left for two minutes in two different kinds of plasma atmosphere specified by the following conditions. For generating a plasma, a known ECR plasma machine was used. Thereafter, the depth of the copper oxide layer was measured by a XPS (X-ray photoelectron spectroscope) method. The result of measurement is shown in FIG. 9. It would be understood from FIG. 9 that, by using the hydrogen/nitrogen plasma treatment, the oxidation of copper can be remarkably prevented.

|  | hydrogen/nitrogen plasma treatment | oxygen plasma treatment |
|---|---|---|
| Processing gas | Mixed gas of $H_2$ and $N_2$ ($H_2/N_2$ = 1/10 (volume ratio)) | oxygen only |
| Substrate temp. | 150° C. | 150° C. |
| Pressure | 2 torr | 2 torr |
| RF bias | 0 | 0 |
| Gas flow rate | $H_2$ = 5 sccm $N_2$ = 50 sccm | $O_2$ = 50 sccm |
| Microwave power | 1000 W | 1000 W |

Second Embodiment

A second embodiment of the method in accordance with the present invention for removing the etching residue and the resist surface hardened layer in a semiconductor device fabricating process, will be described with reference to FIGS. 8A to 8H which are diagrammatic sectional views for illustrating the second embodiment.

Figure 8A:
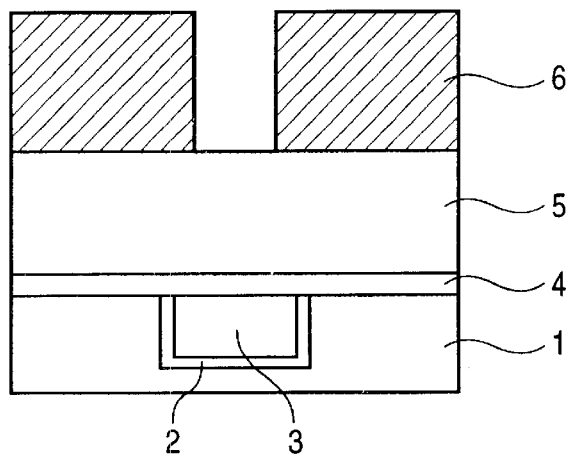
FIGS. 8A to 8H are diagrammatic sectional views for illustrating a second embodiment of the method in accordance with the present invention for removing the etching residue and the resist surface hardened layer in a semiconductor device fabricating process.

As shown in FIG. 8A, after an HSQ (hydrogen silsesquoxane) film 1 is formed on a semiconductor substrate (not. shown) on which circuit-components such as transistors (not shown) are formed, a lower level metal interconnection is formed by a known damascene process. This level metal interconnection is composed of a barrier metal film formed of a TaN film 2 having a film thickness of 50 nm and a copper film 3 formed on the barrier metal film.

After the lower level metal interconnection is formed, a silicon nitride film 4 (having a film thickness of 100 nm) and another HSQ film 5 (having a film thickness of 1200 nm) are formed on the HSQ film 1 in the named order to cover the lower level metal interconnection. Furthermore, a resist film 6 patterned to have a predetermined shape is formed on the HSQ. film 5. Here, the resist film 6 is constituted of for example a chemical amplification resist composed of a combination of a polyhydroxystyrene partially protected by a tertiary butoxycarbonyl group (abbreviated to "t-BOC") and triphenyl sulfonium trifluorosulfonate (acid generating agent).

Figure 8B:
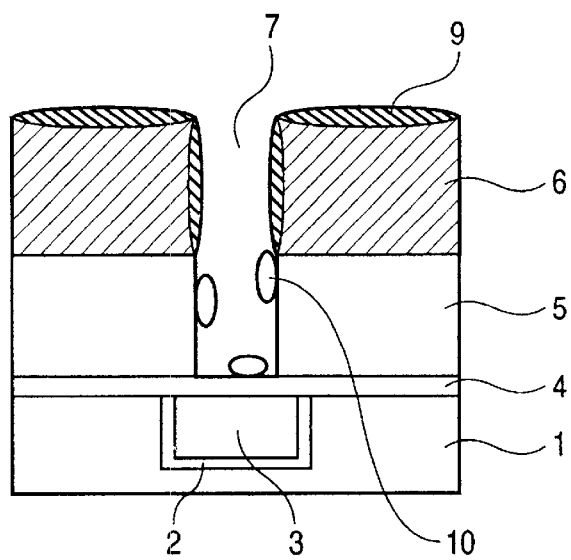

Next, the HSQ film 5 is dry-etched using the resist 6 as a mask until the silicon nitride film 4 is exposed, so that a through-hole 7 is formed as shown in FIG. 8B. An opening diameter of the through-hole is on the order of 0.2 μm. An etching gas being used is a mixed gas of $C_4F_8$, Ar and $O_2$. Since this etching gas has a large etching selection ratio between the silicon oxide film and the silicon nitride film (the etching rate ratio is silicon oxide film: silicon nitride film=20:1), the etching is stopped at the upper surface of the silicon nitride film 4. In this dry-etching, a resist surface hardened layer 9 is formed on the resist film 6, and an etching residue 10 is deposited on an inner wall surface of the through-hole 7.

Succeedingly, by using a known ECR plasma machine, a hydrogen/nitrogen plasma treatment was carried out under the following condition:

| | |
|---|---|
| Processing gas | Mixed gas of $H_2$ and $N_2$ ($H_2/N_2$ = 2/10 (volume ratio)) |
| Substrate temperature | 150° C. |
| Pressure | 0.02 torr |
| RF bias | 20 W |
| Gas flow rate | $H_2$ = 4 sccm |
| | $N_2$ = 20 sccm |
| Microwave power | 1000 W |

Figure 8C:
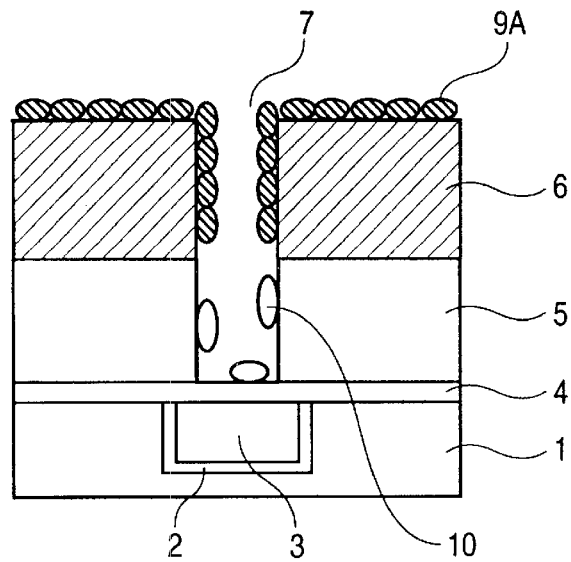

As a result, as shown in FIG. 8C, the resist surface hardened layer 9 causes the change of properties to become a property-changed resist hardened layer 9A which can be removed by a resist remover liquid.

Figure 8D:
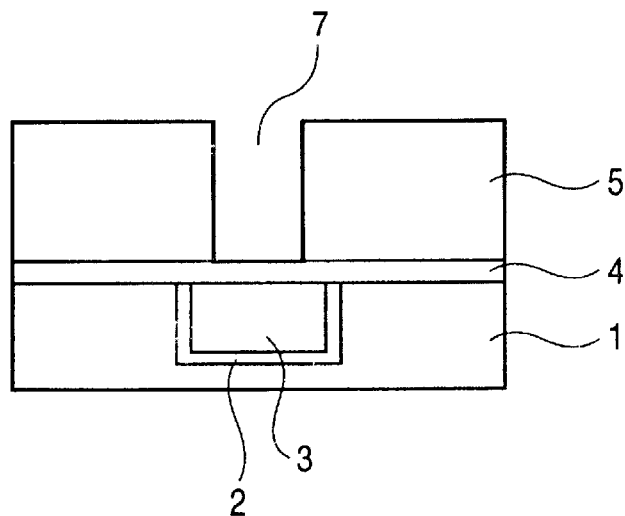

Succeedingly, a wet treatment is carried out by using a resist remover liquid which contains amine compound, so as to remove the resist film 6 as well as the etching residue 10 and the property-changed resist hardened layer 9A which were plasma-treated. Here, since the resist surface hardened layer 9 is treated by the hydrogen/nitrogen plasma treatment as mentioned above, the resist surface hardened layer 9 is converted into the property-changed resist hardened layer 9A which can be removed by a resist remover liquid. Therefore, the inner surface of the through-hole 7 and the surface of the HSQ film 5 are brought into a clean condition by the wet treatment using the resist remover liquid, as shown in FIG. 8D.

Figure 8E:
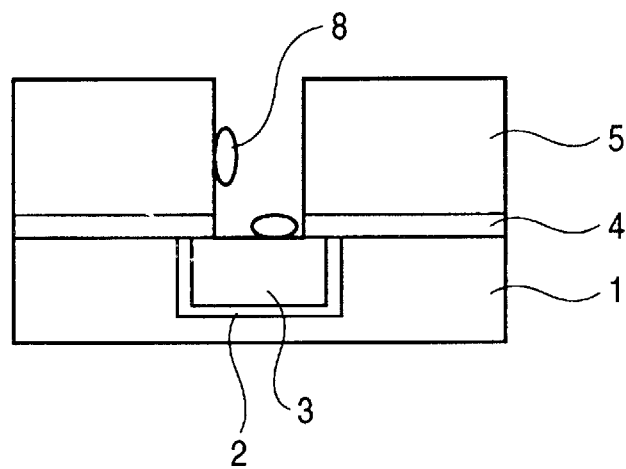
Figure 8F:
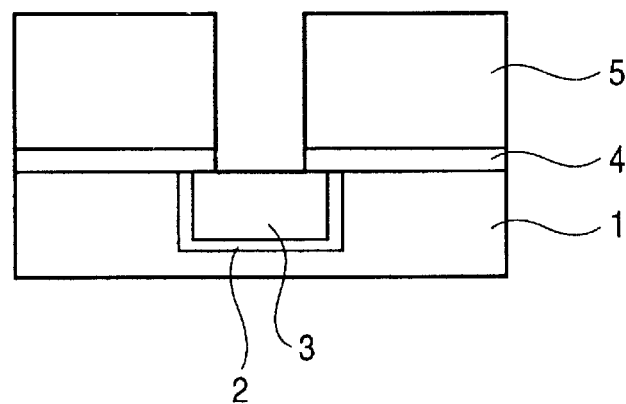

Thereafter, the silicon nitride film 4 is dry-etched until the copper film 3 is exposed as shown in FIG. 8E. An etching gas being used is a mixed gas of $CHF_3$ and Ar. In this dry-etching, an etching residue 8 is deposited on the inner wall surface of the through-hole 7. Succeedingly, a wet treatment is carried out again by using a resist remover liquid which contains amine compound, so as to remove the etching residue 8, as shown in FIG. 8F.

Figure 8G:
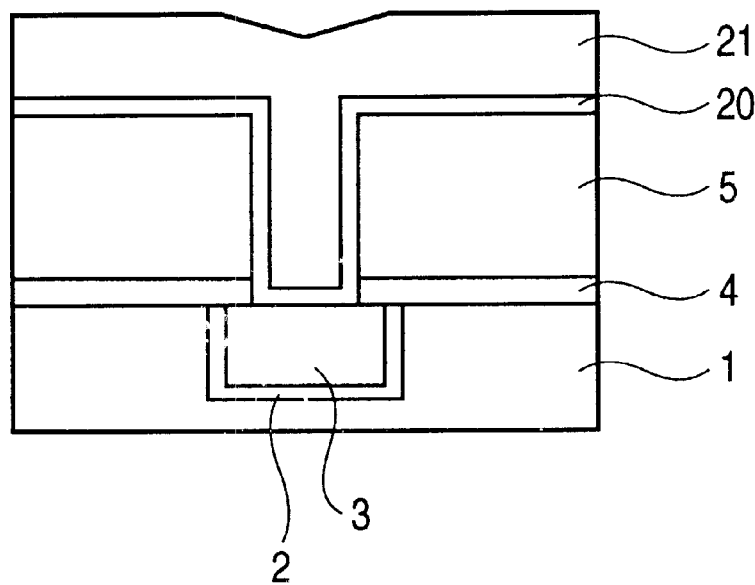
Figure 8H:
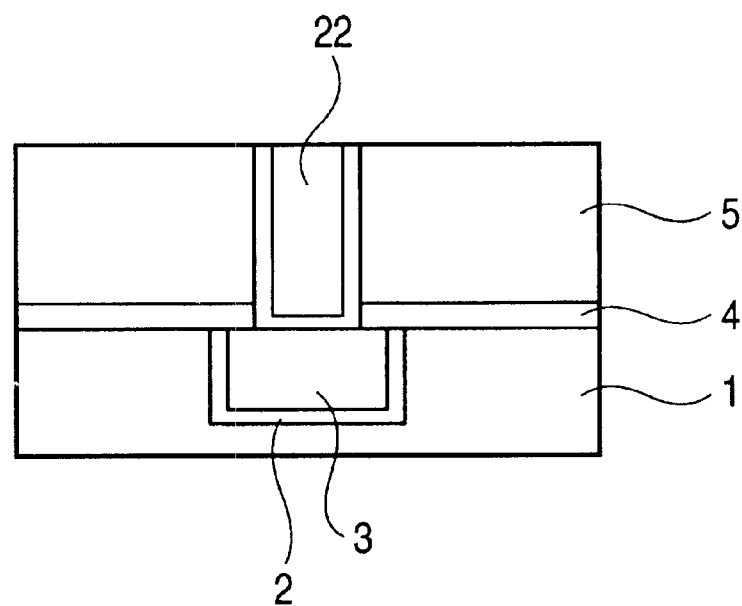

Thereafter, a barrier metal film 20 formed of TaN and a copper film 21 are deposited on the whole surface in the named order, as shown in FIG. 8G, and then, the deposited barrier metal film 20 and copper film 21 are planarized by a CMP process, with the result that a plug 22 for connecting between different levels of interconnection is formed as shown in FIG. 8H. Furthermore, an upper level interconnection (not shown) is formed on the plug 22. Thus, a multi-level interconnection is completed.

Figure 1A:
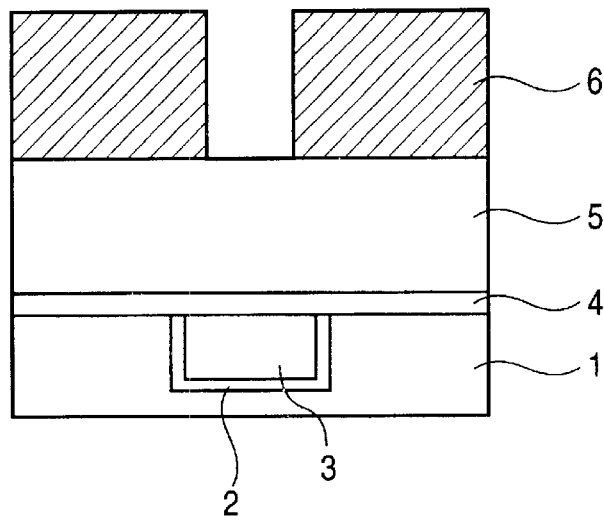
FIGS. 1A to 1C are diagrammatic sectional views for illustrating one example of the prior art method for removing the etching residue and the resist surface hardened layer in a process for forming a through-hole on a copper interconnection.
Figure 1B:
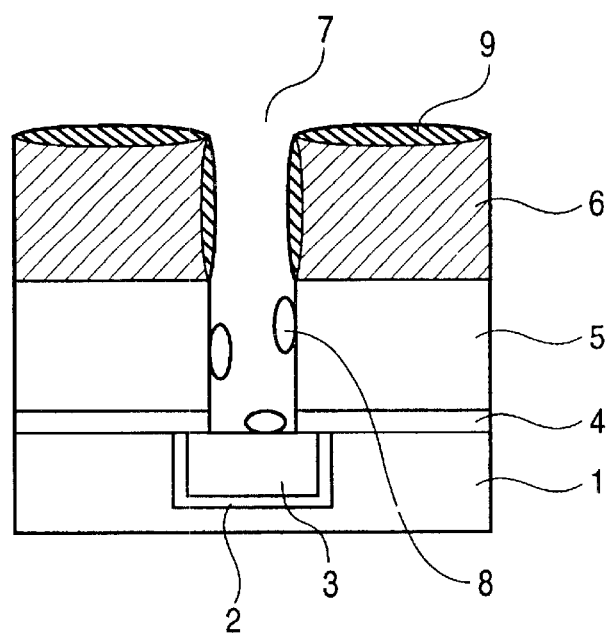
Figure 1C:
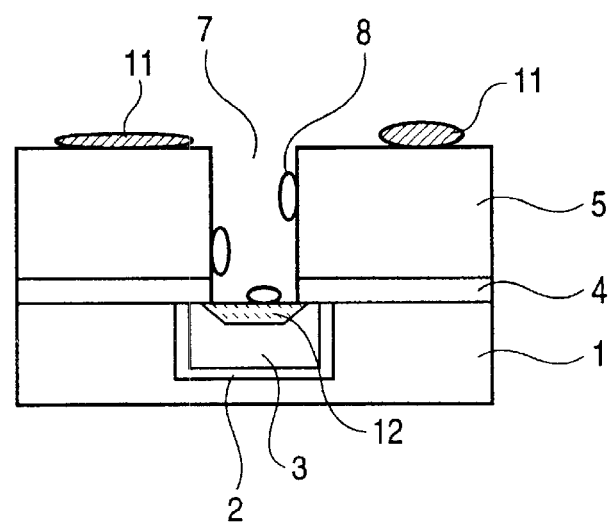
Figure 2:
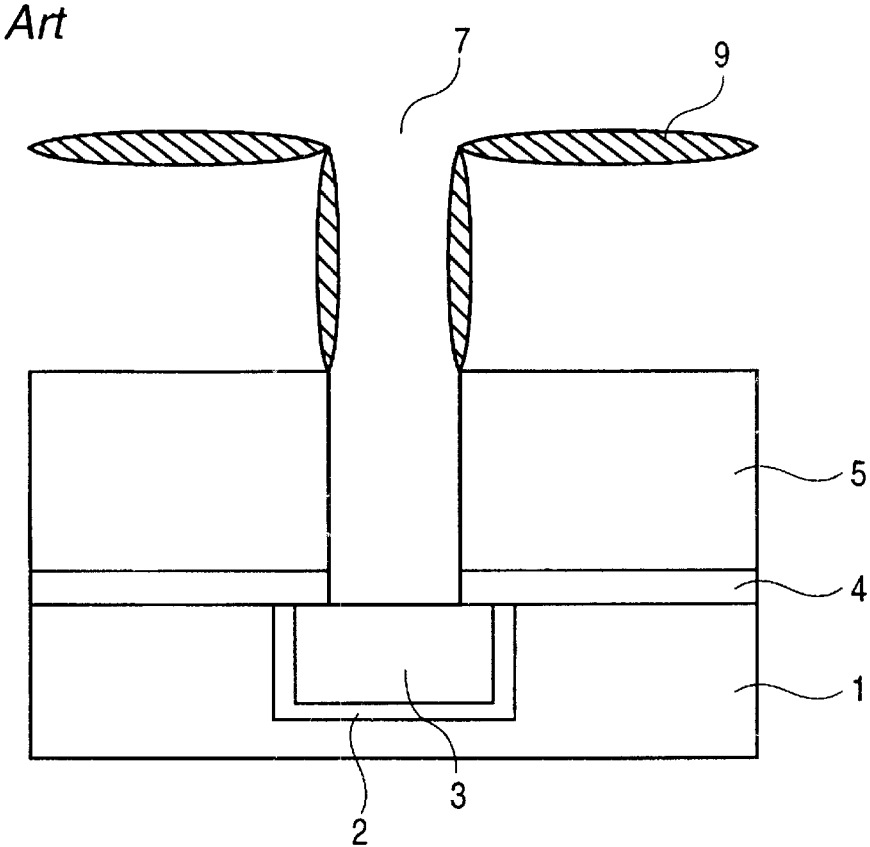
FIG. 2 is a diagrammatic sectional view for illustrating another example of the prior art method for removing the resist film and the etching residue.
Figure 4:
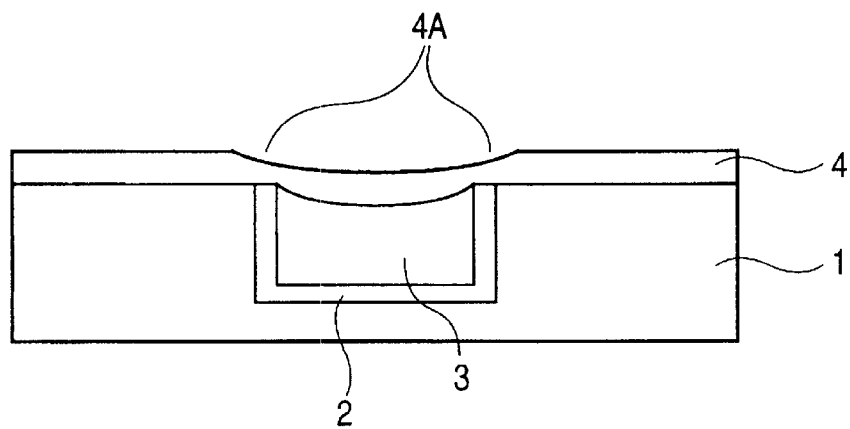
FIG. 4 is a diagrammatic sectional view for illustrating a problem in the third example of the prior art method for removing the etching residue and the resist surface hardened layer.
Figure 3A:
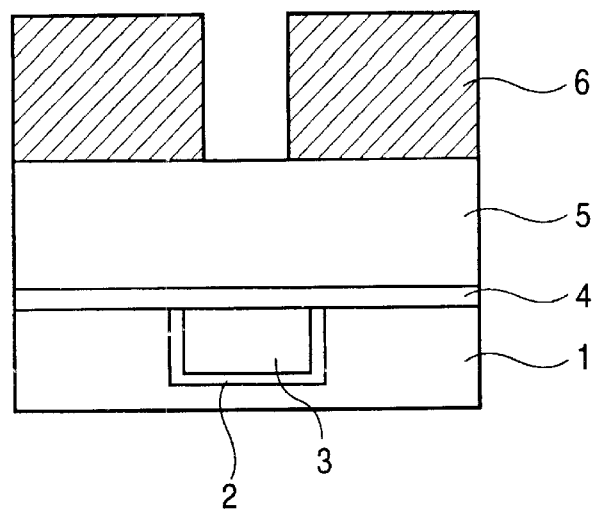
FIGS. 3A to 3F are diagrammatic sectional views for illustrating a third example of the prior art method for removing the etching residue and the resist surface hardened layer in a process for forming a through-hole on a copper interconnection.
Figure 3B:
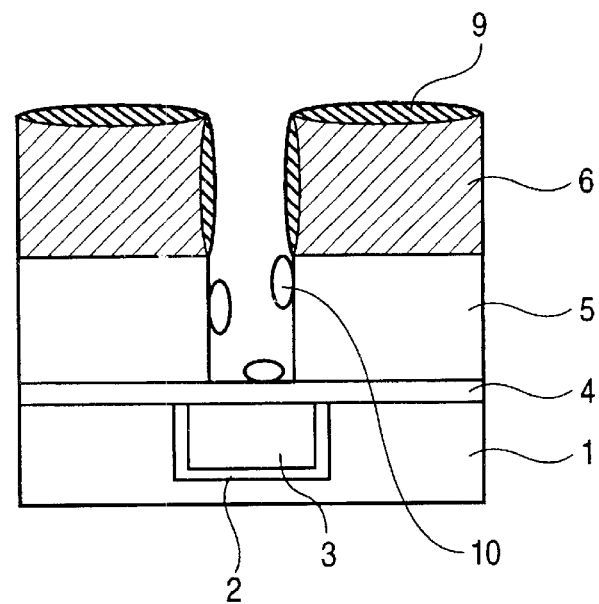
Figure 3C:
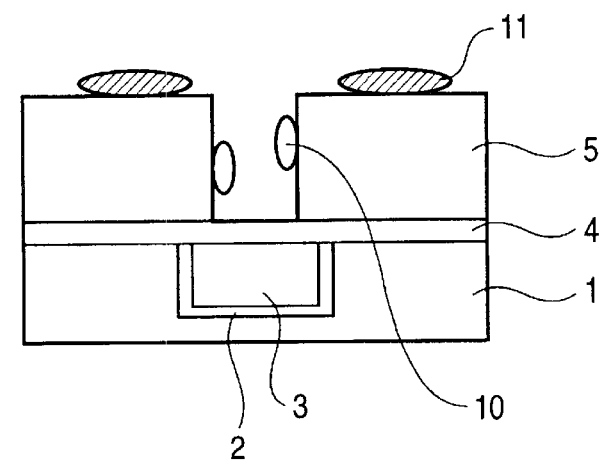
Figure 3D:
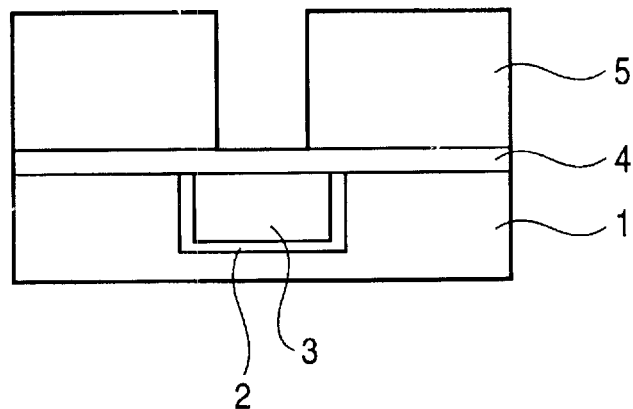
Figure 3E:
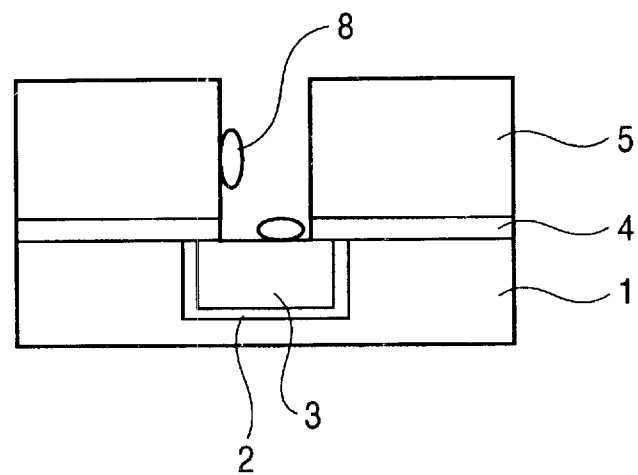
Figure 3F:
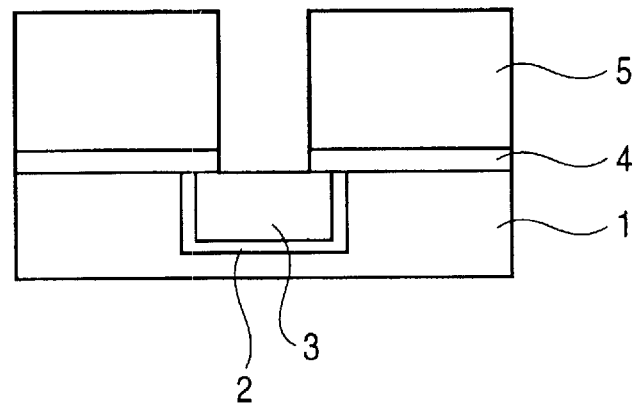
Figure 5A:
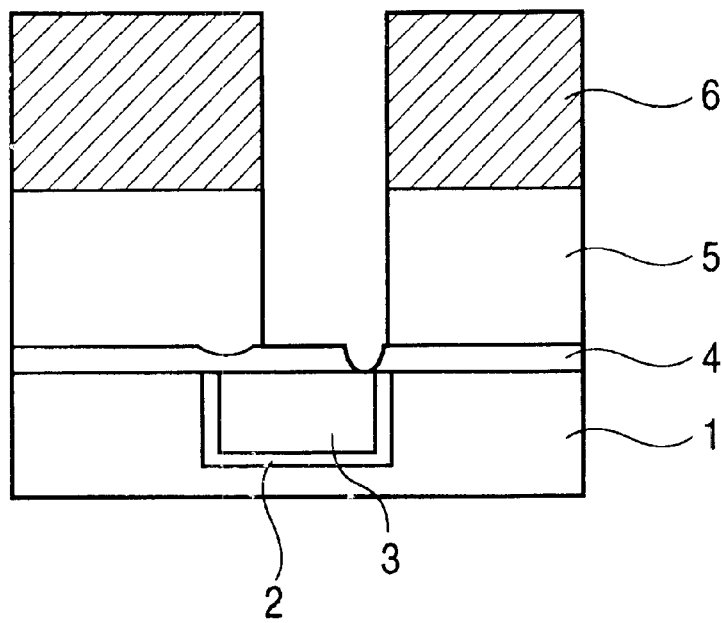
FIGS. 5A and SB are diagrammatic sectional views for illustrating another problem in the third example of the prior art method for removing the etching residue and the resist surface hardened layer.
Figure 5B:
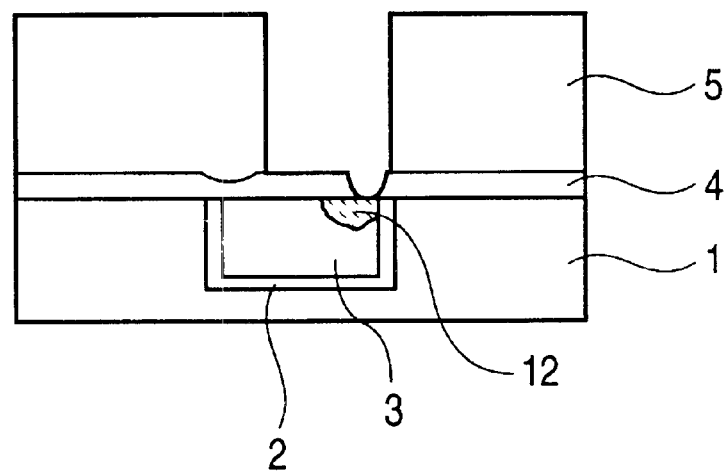
Figure 6:
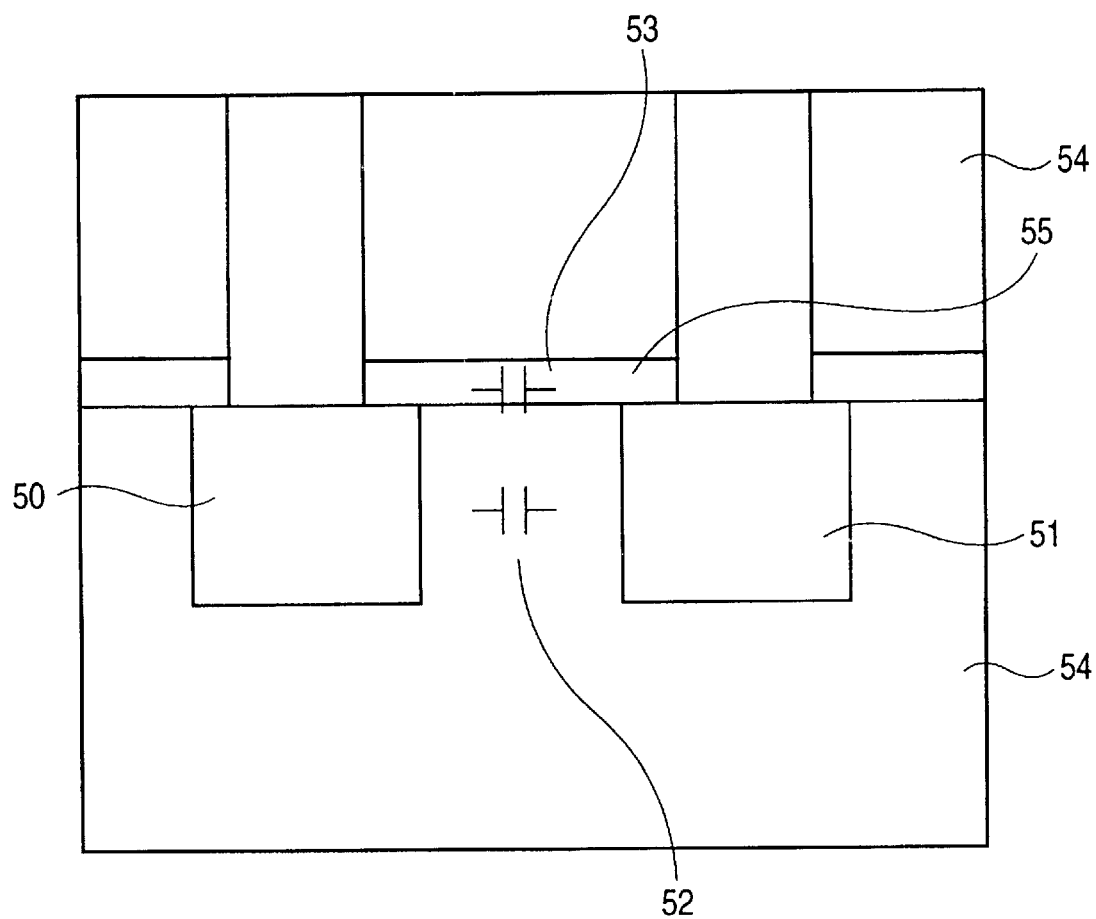
FIG. 6 is a diagrammatic sectional view for illustrating a parasite capacitance in a semiconductor device.

As seen from the above, in this second embodiment, after the completion of the first dry-etching for exposing the silicon nitride film, in place of the prior art resist removal by the oxygen plasma ashing, the resist is removed by a combination of the hydrogen/nitrogen plasma treatment and the wet treatment using the resist remover liquid. Therefore, even if the thinned portion 14A as shown in FIG. 4 occurs in the silicon nitride film 4 and even if the resist misalignment occur as shown in FIG. SA, the resist film and the deposits can be advantageously removed while preventing the oxidation of the copper film 3. In addition, it is possible to prevent the elevation of the dielectric constant of the HSQ film.

As mentioned above, according to the present invention, since the resist film and the deposits are removed by a combination of the non-oxidizing gas plasma treatment and the wet treatment using the resist remover liquid, the resist film and the deposits such as the resist surface hardened layer formed on the resist film can be advantageously removed while preventing oxidation of an easily oxidizable film.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor device fabricating process including the steps of forming an easily oxidizable film on an insulating layer, said film being such that upon exposure to oxygen, oxidation proceeds from a surface to inside the film with the result that a characteristic inherent in the film is changed, forming a patterned resist film on said easily oxidizable film, dry-etching said easily oxidizable film using said patterned resist film as a mask to expose said easily oxidizable film, carrying out a plasma treatment using a non-oxidizing gas, and carrying out a wet treatment for removing said resist film and a resist surface hardened layer which was generated in said dry-etching.

2. A semiconductor device fabricating process claimed in claim 1 wherein said non-oxidizing gas comprises a material selected from the group consisting of hydrogen, ammonia, nitrogen, an inert gas and their mixed gas.

3. A semiconductor device fabricating process claimed in claim 2 wherein said wet treatment is carried out by using a remover liquid which contains an amine compound.

4. A semiconductor device fabricating process claimed in claim 1 wherein said non-oxidizing gas comprises a reducing gas which contains hydrogen.

5. A semiconductor device fabricating process claimed in claim 4 wherein said wet treatment is carried out by using a remover liquid which contains an amine compound.

6. A semiconductor device fabricating process claimed in claim 1 wherein said wet treatment is carried out by using a remover liquid which contains an amine compound.

7. A semiconductor device fabricating process including the steps of forming a copper-based metal film on an insulating layer, forming an insulating film on said copper-based metal film, forming a patterned resist film on said insulating film, dry-etching said insulating film using said patterned resist film as a mask to form a hole penetrating through said insulating film, carrying out a plasma treatment using an non-oxidizing gas, and carrying out a wet treatment for removing said resist film and a resist surface hardened layer which was generated in said dry-etching.

8. A semiconductor device fabricating process claimed in claim 7 wherein said non-oxidizing gas comprises a material selected from the group consisting of hydrogen, ammonia, nitrogen, an inert gas and their mixed gas.

9. A semiconductor device fabricating process claimed in claim 8 wherein said wet treatment is carried out by using a remover liquid which contains an amine compound.

10. A semiconductor device fabricating process claimed in claim 7 wherein said non-oxidizing gas comprises a reducing gas which contains hydrogen.

11. A semiconductor device fabricating process claimed in claim 10 wherein said wet treatment is carried out by using a remover liquid which contains an amine compound.

12. A semiconductor device fabricating process claimed in claim 7 wherein said wet treatment is carried out by using a remover liquid which contains an amine compound.

13. A semiconductor device fabricating process claimed in claim 10, further including the step of forming an etching stopper film on said copper-based metal film before forming said insulating film, so that said insulating film is formed to cover said etching stopper film, and wherein said dry-etching forms in said insulating film said hole reaching said etching stopper film, and after said resist film and said resist surface hardened layer are removed, said etching stopper film is removed.

14. A semiconductor device fabricating process claimed in claim 13 wherein said non-oxidizing gas comprises a material selected from the group consisting of hydrogen, ammonia, nitrogen, an inert gas and their mixed gas.

15. A semiconductor device fabricating process claimed in claim 14 wherein said wet treatment is carried out by using a remover liquid which contains an amine compound.

16. A semiconductor device fabricating process claimed in claim 13 wherein non-oxidizing gas comprises a reducing gas which contains hydrogen.

17. A semiconductor device fabricating process claimed in claim 16 wherein said wet treatment is carried out by using a remover liquid which contains an amine compound.

18. A semiconductor device fabricating process claimed in claim 13 wherein said wet treatment is carried out by using a remover liquid which contains an amine liquid.

19. A semiconductor device fabricating process including the steps of forming a patterned resist film on an insulating film which is formed of a material selected from the group consisting of HSQ, organic SOG and inorganic SOG, dry-etching said insulating film using said patterned resist film as a mask, carrying out a plasma treatment using an non-oxidizing gas, and carrying out a wet treatment for removing said resist film and a resist surface hardened layer which was generated in said dry-etching.

20. A semiconductor device fabricating process claimed in claim 19 wherein said non-oxidizing gas comprises a reducing gas which contains hydrogen, and said wet treatment is carried out by using a remover liquid which contains an amine compound.

21. A semiconductor device fabrication process as claimed in claim 1, wherein said easily oxidizable film is formed of a material selected from the group consisting of HSQ, organic SOG and inorganic SOG.

22. A semiconductor device fabrication process claimed in claim 7, wherein said copper-based metal film comprises copper or copper alloy.

* * * * *